United States Patent
Chen et al.

(10) Patent No.: US 11,553,602 B2
(45) Date of Patent: Jan. 10, 2023

(54) METHOD FOR MANUFACTURING CIRCUIT BOARD WITH HEAT DISSIPATION FUNCTION

(71) Applicants: QING DING PRECISION ELECTRONICS (HUAIAN) CO., LTD, Huai an (CN); Avary Holding (Shenzhen) Co., Limited., Shenzhen (CN); GARUDA TECHNOLOGY CO., LTD., New Taipei (TW)

(72) Inventors: Yin-Ju Chen, New Taipei (TW); Jing-Cyuan Yang, New Taipei (TW); Yen-Chang Chu, New Taipei (TW)

(73) Assignees: QING DING PRECISION ELECTRONICS (HUAIAN) CO., LTD, Huai an (CN); Avary Holding (Shenzhen) Co., Limited., Shenzhen (CN); GARUDA TECHNOLOGY CO., LTD., New Taipei (TW)

( * ) Notice: Subject to any disclaimer, the term of this patent is extended or adjusted under 35 U.S.C. 154(b) by 71 days.

(21) Appl. No.: 17/354,478

(22) Filed: Jun. 22, 2021

(65) Prior Publication Data
US 2022/0377913 A1 Nov. 24, 2022

(30) Foreign Application Priority Data
May 24, 2021 (CN) .......................... 202110563540.0

(51) Int. Cl.
*H05K 3/46* (2006.01)
*H05K 3/38* (2006.01)
(Continued)

(52) U.S. Cl.
CPC ........... *H05K 3/4676* (2013.01); *H05K 3/388* (2013.01); *B82Y 40/00* (2013.01); *H05K 1/0209* (2013.01); *H05K 2201/026* (2013.01)

(58) Field of Classification Search
CPC ...... B82Y 40/00; H05K 1/0209; H05K 3/388; H05K 3/4676; H05K 2201/026
See application file for complete search history.

(56) References Cited

U.S. PATENT DOCUMENTS 7,785,938 B2 * 8/2010 Yamaguchi ............. H01L 21/84
438/455
10,563,095 B2 * 2/2020 Shinba .................... H01L 23/36

FOREIGN PATENT DOCUMENTS

CN 112391128 A 2/2021
JP 2013-247233 A * 12/2013
(Continued)

*Primary Examiner* — Carl J Arbes
(74) *Attorney, Agent, or Firm* — ScienBiziP, P.C.

(57) ABSTRACT

A method for manufacturing a circuit board, includes: stacking a first peelable film on a second peelable film, and disposing fluffy carbon nanotubes between the first peelable film and the second peelable film, thereby obtaining a carbon nanotube layer; pressing the first peelable film, the carbon nanotube layer, and the second peelable film to compact the fluffy carbon nanotubes, thereby obtaining a thermal conductive layer; removing the first peelable film, and disposing a first adhesive layer, a first dielectric layer, and a first circuit layer on a side of the thermal conductive layer away from the second peelable film; removing the second peelable film, and disposing a second adhesive layer, a second dielectric layer, and a second circuit layer on a side of the thermal conductive layer away from the first adhesive layer; mounting an electronic component on the first circuit layer.

10 Claims, 13 Drawing Sheets

(51) Int. Cl.
*H05K 1/02* (2006.01)
*B82Y 40/00* (2011.01)

(56) References Cited

FOREIGN PATENT DOCUMENTS

| JP | 2016066607 | A | * | 4/2016 |
| JP | 6127417 | B | * | 5/2017 |
| TW | I427132 | | | 2/2014 |

* cited by examiner

METHOD FOR MANUFACTURING CIRCUIT BOARD WITH HEAT DISSIPATION FUNCTION

FIELD

The disclosure relates to circuit boards, and more particularly, to a method for manufacturing a circuit board with heat dissipation function.

BACKGROUND

Circuit boards may include circuit substrates and electronic components mounted on the circuit substrates. The number of the electronic components that a single circuit substrate needs to accommodate is increased because the electronic devices are becoming more multifunctional. However, electronic components generate heat when working, the circuit substrate may be deformed due to excessive heat and the electronic components may be damaged if the heat cannot be dissipated in time.

BRIEF DESCRIPTION OF THE DRAWINGS

Many aspects of the disclosure can be better understood with reference to the following drawings. The components are not necessarily drawn to scale, the emphasis instead being placed upon clearly illustrating the principles of the disclosure.

DETAILED DESCRIPTION

Implementations of the disclosure will now be described, by way of embodiments only, with reference to the drawings. It should be noted that the embodiments and the features of the present disclosure can be combined without conflict. Specific details are set forth in the following description to make the present disclosure to be fully understood. The embodiments are only some and not all the embodiments of the present disclosure. Based on the embodiments of the present disclosure, other embodiments obtained by a person of ordinary skill in the art without creative efforts shall be within the scope of the present disclosure.

Unless defined otherwise, all technical and scientific terms used herein have the same meaning as commonly understood by one of ordinary skill in the art. The terms used herein in the specification of the present disclosure are only for describing the embodiments, and are not intended to limit the present disclosure. The term "and/or" as used herein includes any combination of one or more related items.

In the embodiments of the present disclosure, and not as a limitation of the present disclosure, the term "connection" used in the specification and claims of the present disclosure is not limited to physical or mechanical connection, no matter direct connection or indirect connection. The terms of "up", "down", "above", "below", "left", "right", etc., are only used to indicate the relative position relationship. When the absolute position of a described element changes, the relative positions correspondingly changes.

Figure 13:
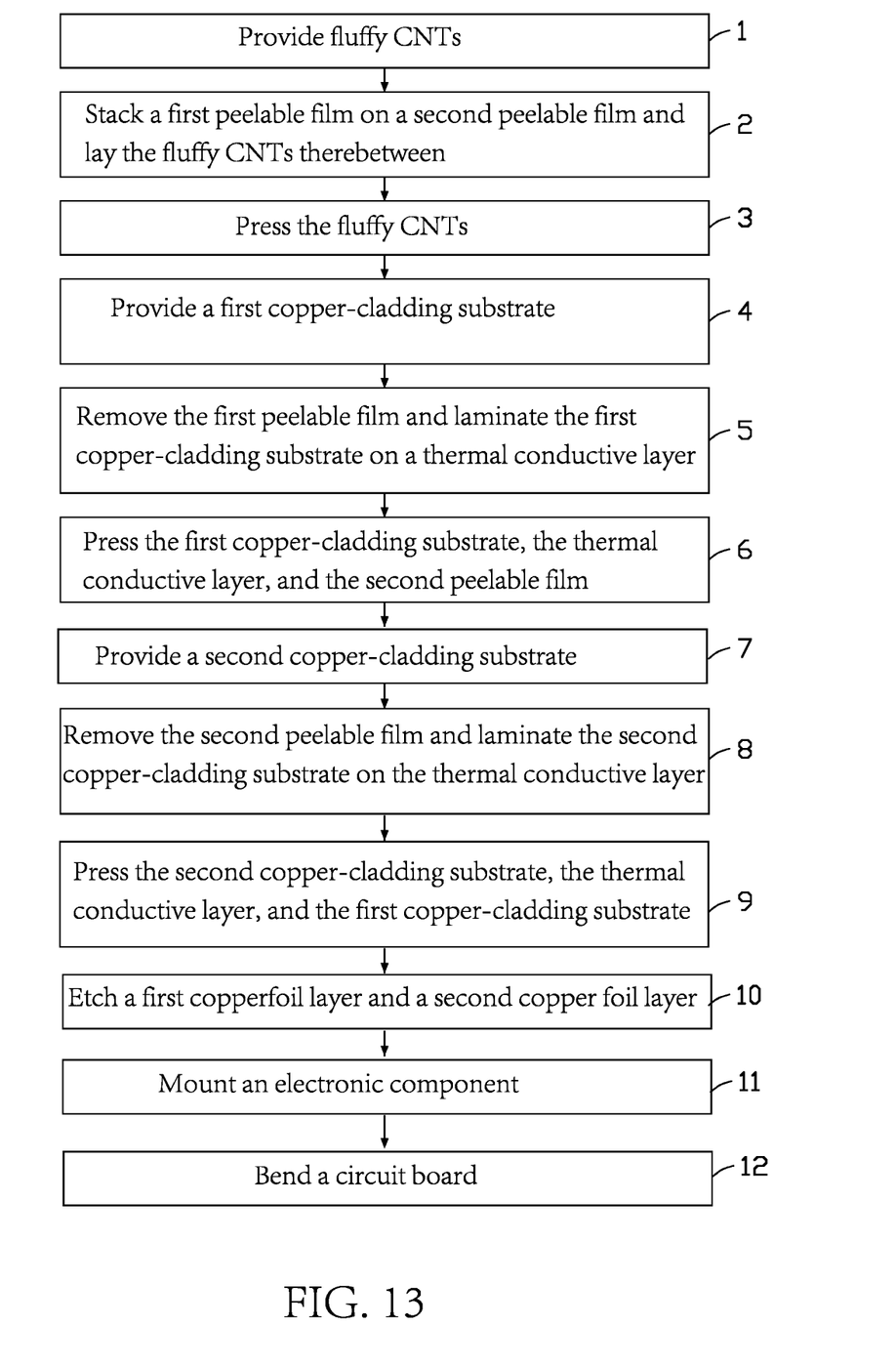
FIG. 13 is a flowchart of an embodiment of a method for manufacturing a circuit board according to the present disclosure.

Referring to FIG. 13, a method for manufacturing a circuit board is presented in accordance with an embodiment. The method is provided by way of example, as there are a variety of ways to carry out the method. The method can begin at block 1.

Figure 1:
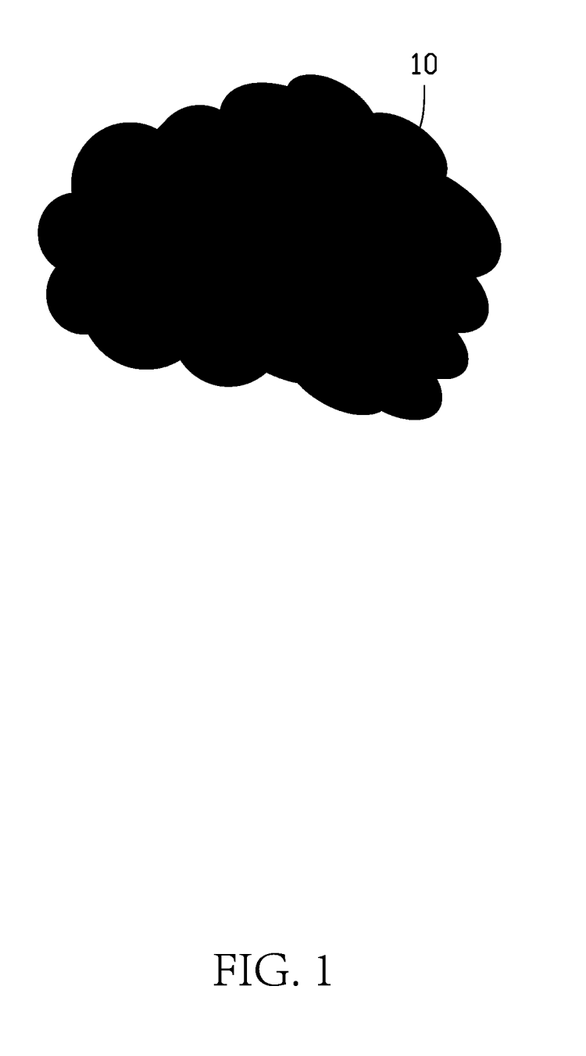
FIG. 1 is a diagrammatic view of an embodiment of fluffy carbon nanotube according to the present disclosure.

At block 1, referring to FIG. 1, fluffy carbon nanotubes (CNTs) 10 are provided.

In some embodiments, the fluffy carbon nanotubes are cotton-like macroscopic structures. The fluffy carbon nanotubes are composed of carbon nanotubes bundles with a diameter of several micrometers, and have a low density of 3-10 g/L.

In some embodiments, a diameter of each fluffy carbon nanotube 10 is about 70 mm. The fluffy carbon nanotubes 10 can be prepared by an in-situ floating catalyst chemical vapor deposition (FC-CVD), a hydrothermal method, or a photocatalytic degradation method.

Figure 2:
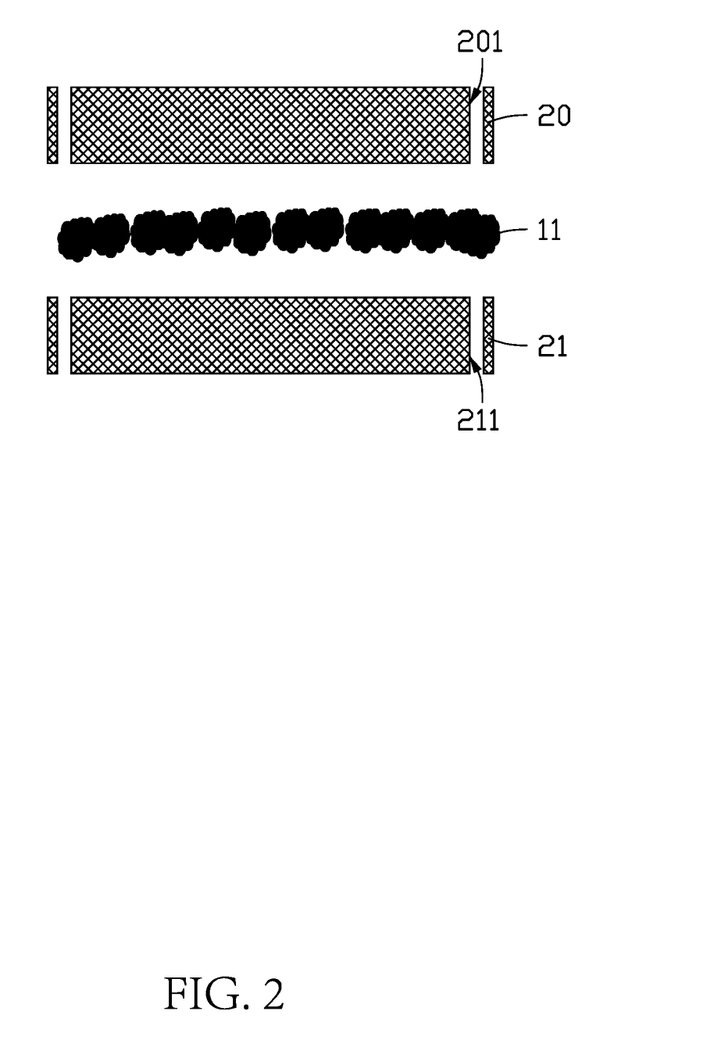
FIG. 2 is a diagrammatic view showing the fluffy carbon nanotubes of FIG. 1 disposed between a first insulating layer and a second insulating layer.

At block 2, referring to FIG. 2, a first peelable film 20 and a second peelable film 21 are provided. The first peelable film 20 and the second peelable film 21 are stacked, and the fluffy carbon nanotubes 10 are laid between the first peelable film 20 and the second peelable film 21 to form a carbon nanotube layer 11.

In some embodiments, each of the first peelable film 20 and the second peelable film 21 is made of an insulating resin. For example, each of the first peelable film 20 and the second peelable film 21 may be made of a material selected from epoxy resin, polypropylene (PP), BT resin, polyphenylene oxide (PPO), polyimide (PI), polyethylene terephthalate (PET), polyethylene naphthalate (PEN), and any combination thereof. The first peelable film 20 and the second peelable film 21 may be made of a same material or different materials.

Figure 3:
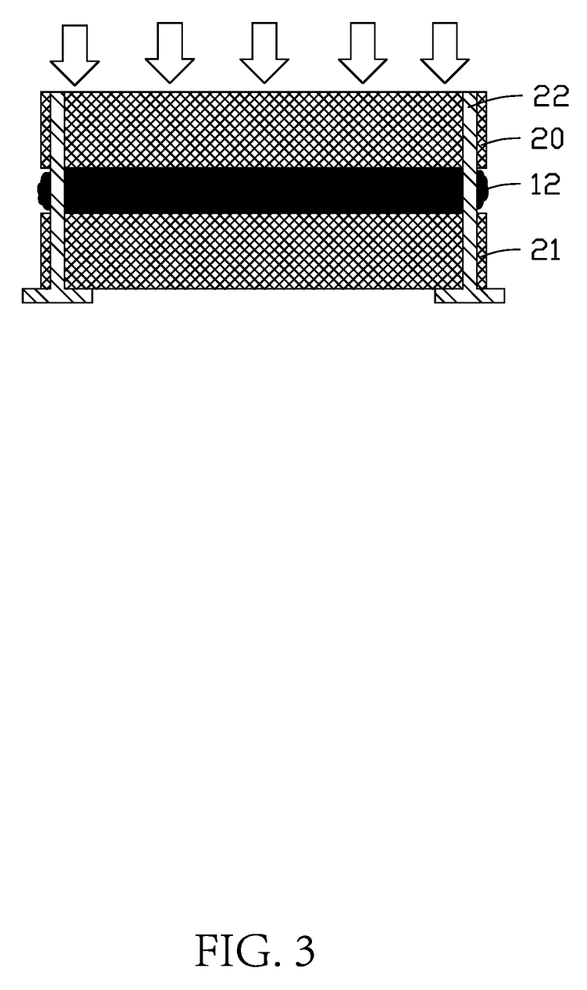
FIG. 3 is a diagrammatic view showing the fluffy carbon nanotubes of FIG. 2, pressed to obtain a thermal conductive layer.

At block 3, referring to FIG. 3, the first peelable film 20, the carbon nanotube layer 11, and the second peelable film 21 are pressed together, thereby compacting the fluffy carbon nanotubes 10 of the carbon nanotube layer 11 to obtain a heat conduction layer 12. That is, gaps in the fluffy carbon nanotubes 10 of the carbon nanotube layer 11 are reduced after being pressed. The fluffy carbon nanotubes 10 change from a fluffy form to a relatively dense form.

Referring to FIGS. 2 and 3, in some embodiments, the first peelable film 20 and the second peelable film 21 define a first alignment hole 201 and a second alignment hole 211, respectively. The first alignment hole 201 passes through the first peelable film 20, and the second alignment hole 211 passes through the second peelable film 21. When the first peelable film 20 and the second peelable film 21 are stacked, the first alignment hole 201 and the second alignment hole 211 align with each other. Before pressing the first peelable film 20, the carbon nanotube layer 11, and the second peelable film 21, a positioning pillar 22 is inserted through the first alignment hole 201, the thermal conductive layer 12, and the second alignment hole 211. After the pressing, the positioning pillar 22 can ensure that the pressure is along the extending direction of the positioning pillar 22.

Figure 4:
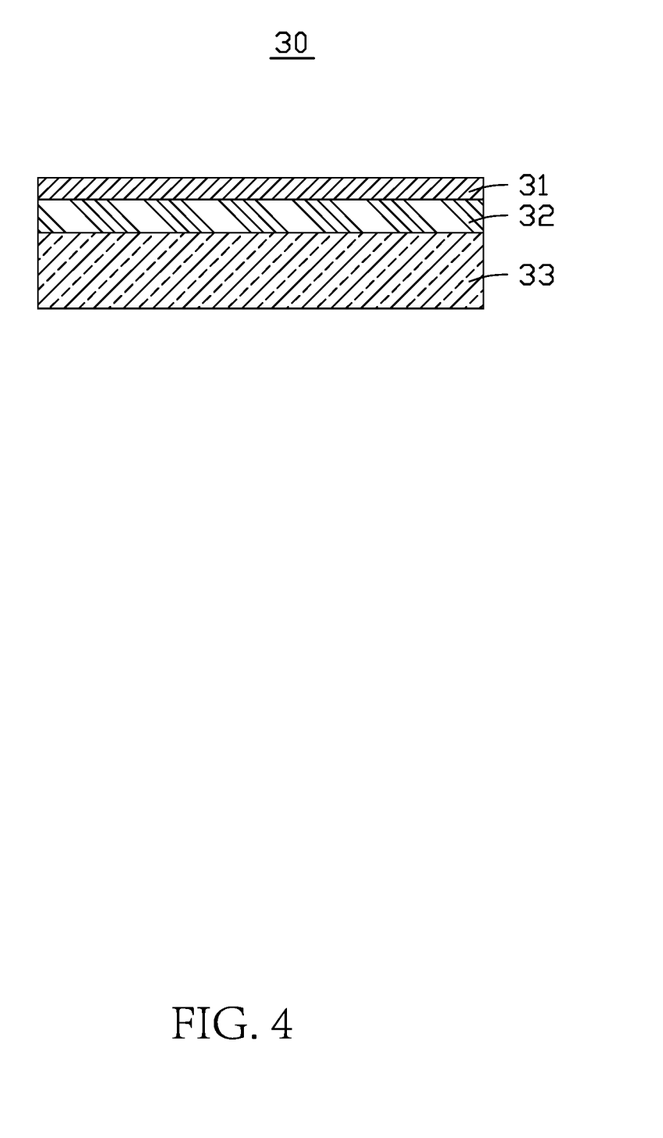
FIG. 4 is a diagrammatic view of an embodiment of a first copper-cladding substrate according to the present disclosure.

At block 4, referring to FIG. 4, a first copper-cladding substrate 30 is provided. The first copper-cladding substrate 30 includes a first adhesive layer 31, a first dielectric layer 32, and a first copper foil layer 33 stacked in that order.

In some embodiments, the first dielectric layer 32 is made of an insulating resin. For example, the first dielectric layer 32 can be made of a material selected from epoxy resin, polypropylene, BT resin, polyphenylene ether, polyimide, polyethylene terephthalate, polyethylene naphthalate, and any combination thereof.

In some embodiments, the first adhesive layer 31 may be made of pure glue.

Figure 5:
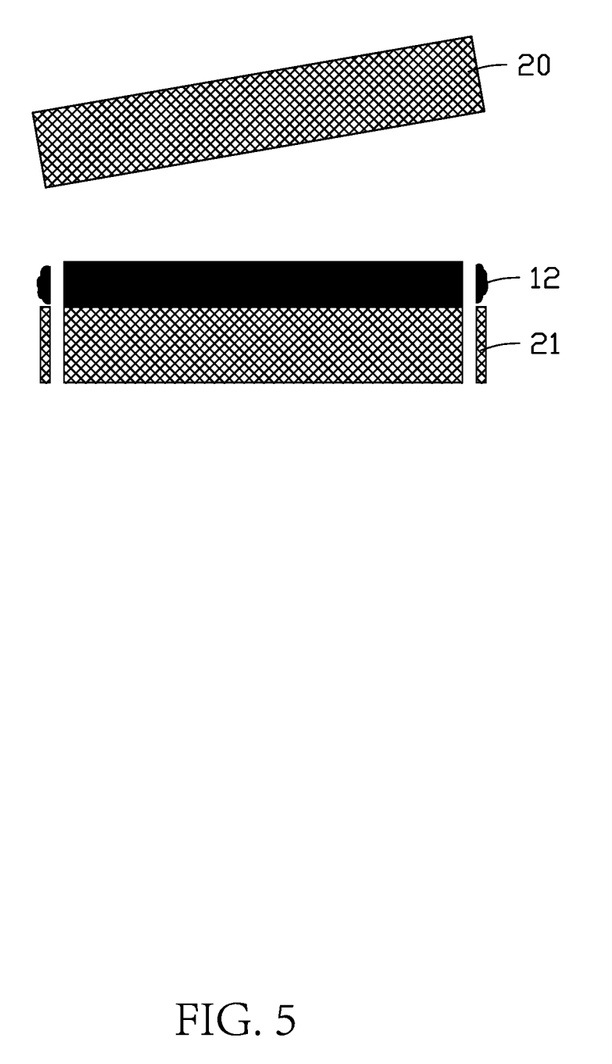
FIG. 5 is a diagrammatic view wherein the first insulating layer of FIG. 3 is removed.
Figure 6:
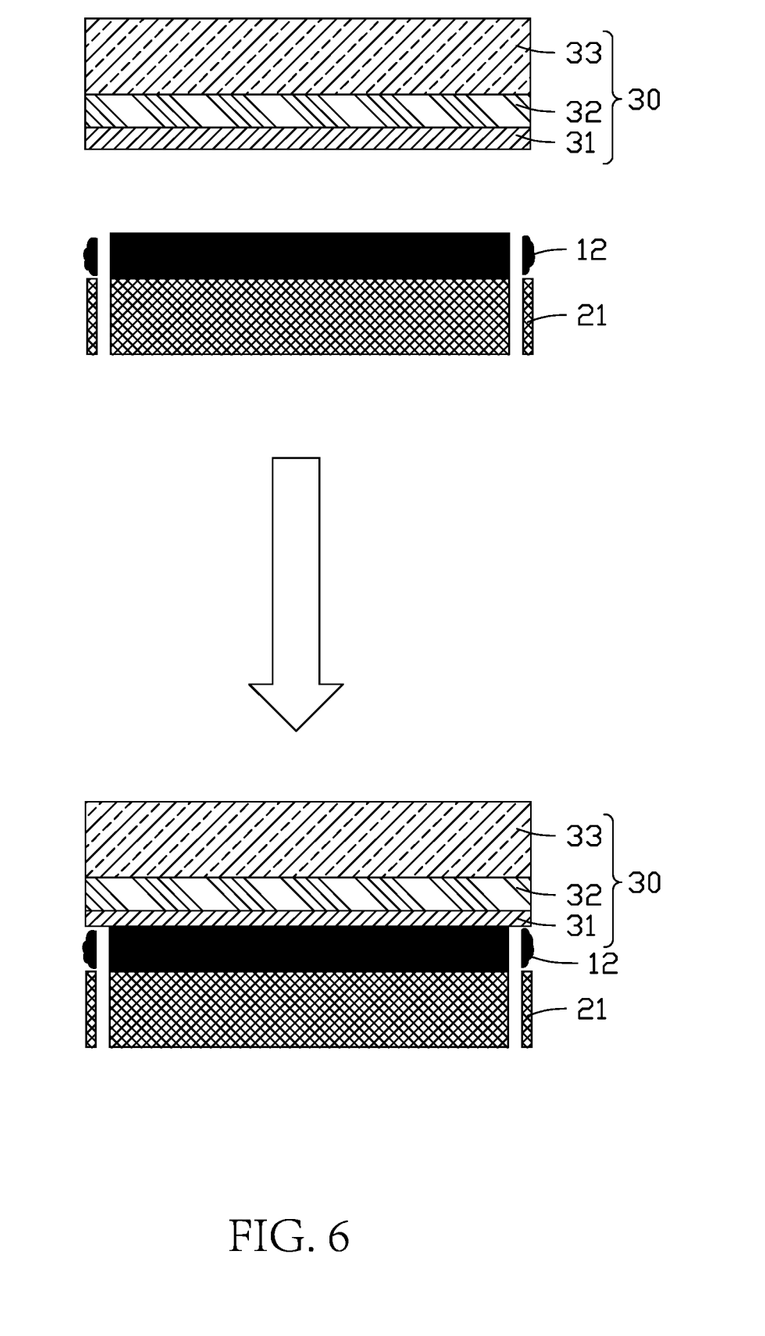
FIG. 6 is a diagrammatic view of the first copper-cladding substrate of FIG. 4, pressed on the thermal conductive layer of FIG. 5.

At block 5, referring to FIGS. 5 and 6, the first peelable film 20 is removed, and the first copper-cladding substrate 30 is laminated on a side of the thermal conductive layer 12 away from the second peelable film 21, so that the thermal conductive layer 12 is disposed between the first adhesive layer 31 and the second peelable film 21.

In some embodiment, before removing the first peelable film 20, the positioning pillar 22 is first removed.

At block 6, referring to FIG. 6, the first copper-cladding substrate 30, the thermal conductive layer 12, and the second peelable film 21 are pressed together, so that the thermal conductive layer 12 is bonded to the first adhesive layer 31.

The first adhesive layer 31 can bond a portion of the fluffy carbon nanotubes 10 of the thermal conductive layer 12 adjacent to the first adhesive layer 31 together.

Figure 7:
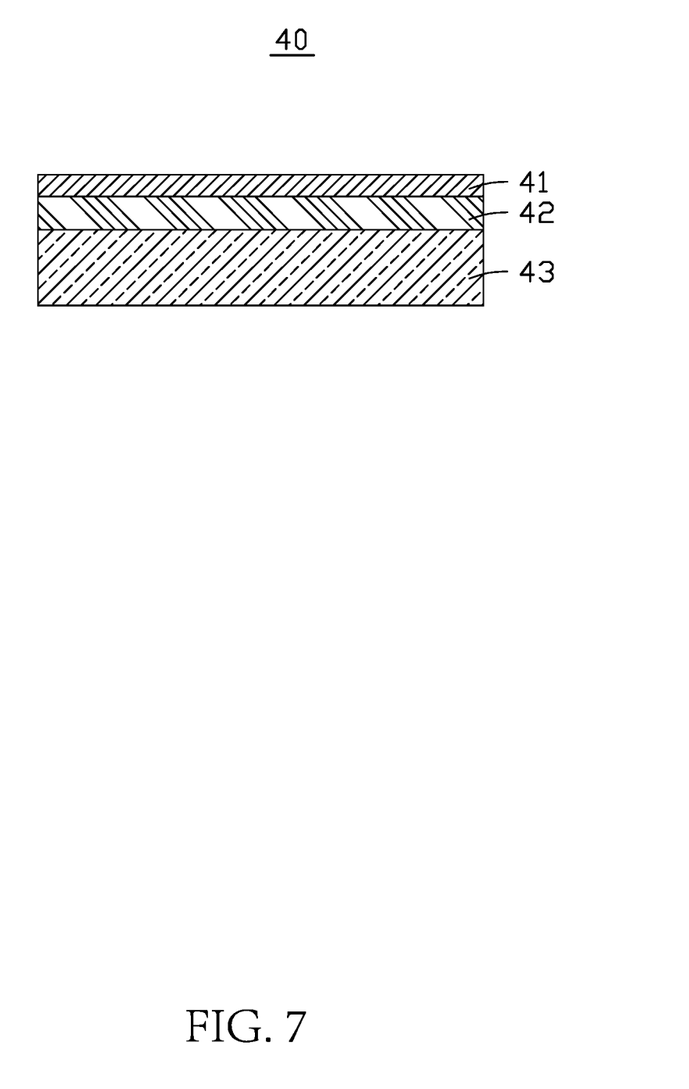
FIG. 7 is a diagrammatic view of an embodiment of a second copper-cladding substrate according to the present disclosure.

At block 7, referring to FIG. 7, a second copper-cladding substrate 40 is provided. The second copper-cladding substrate 40 includes a second adhesive layer 41, a second dielectric layer 42, and a second copper foil layer 43 stacked in that order.

In some embodiments, the second dielectric layer 42 is made of an insulating resin. For example, the second dielectric layer 42 can be made of a material selected from epoxy resin, polypropylene, BT resin, polyphenylene ether, polyimide, polyethylene terephthalate, polyethylene naphthalate, and any combination thereof. The second dielectric layer 42 and the first dielectric layer 32 may be made of a same material or different materials.

In some embodiments, the second adhesive layer 41 may be made of pure glue. The second adhesive layer 41 and the first adhesive layer 31 may be made of a same material or different materials.

Figure 8:
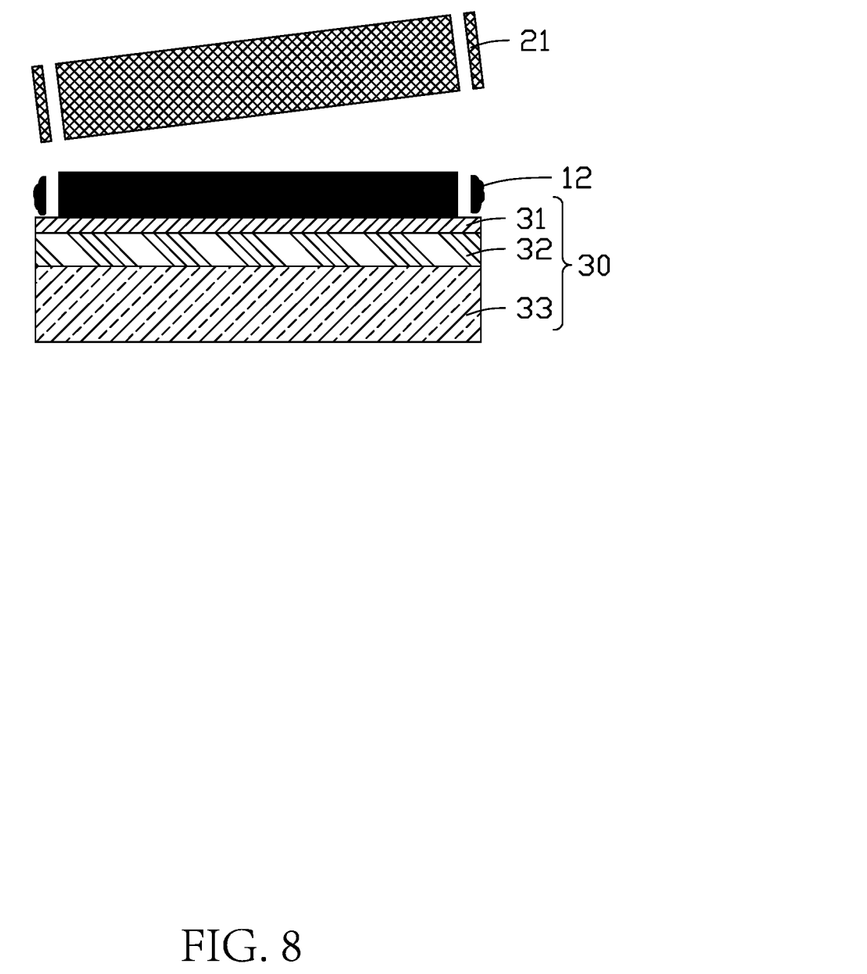
FIG. 8 is a diagrammatic view wherein the second insulating layer of FIG. 6 is removed.
Figure 9:
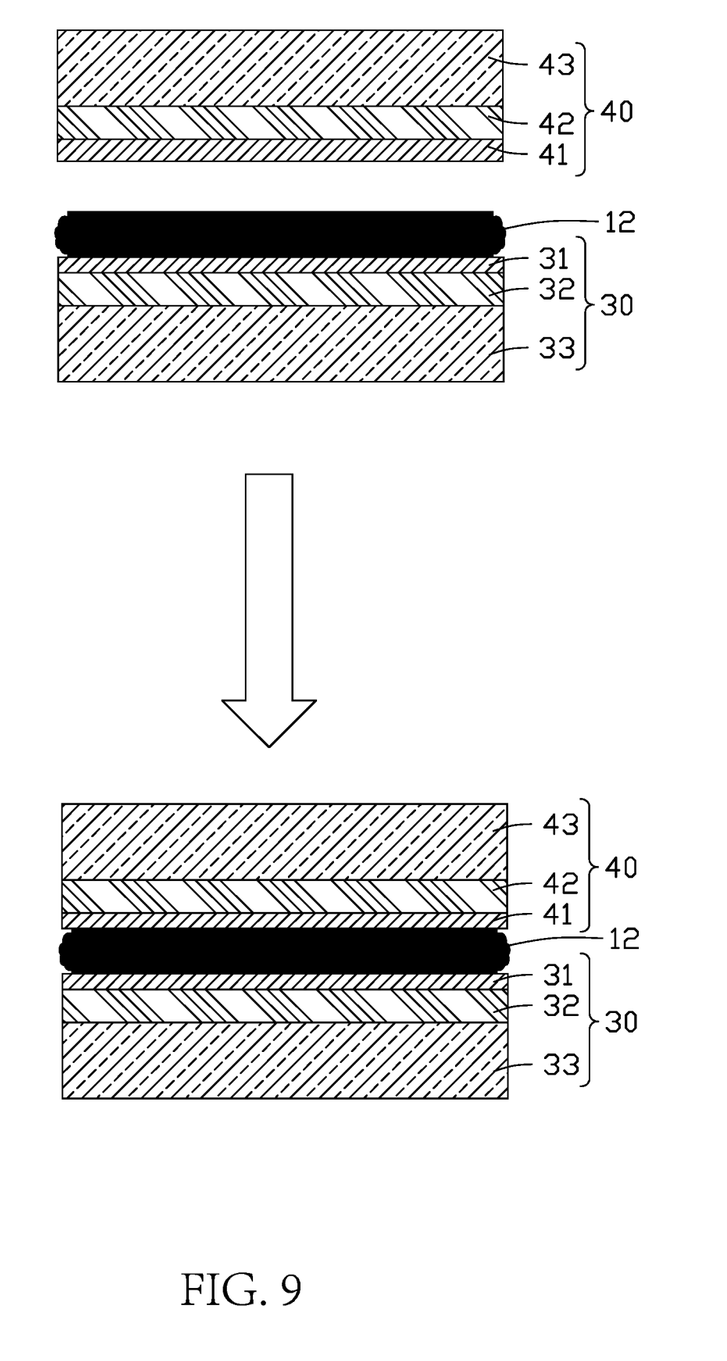
FIG. 9 is a diagrammatic view of the second copper-cladding substrate of FIG. 7, pressed on the thermal conductive layer of FIG. 8.

At block 8, referring to FIGS. 8 and 9, the second peelable film 21 is removed, and the second copper-cladding substrate 40 is laminated on a side of the thermal conductive layer 12 away from the first adhesive layer 31, so that the thermal conductive layer 12 is disposed between the first adhesive layer 31 and the second adhesive layer 41.

At block 9, referring to FIG. 9, the second copper-cladding substrate 40, the thermal conductive layer 12, and the first copper-cladding substrate 30 are pressed together, so that the thermal conductive layer 12 is bonded to the second adhesive layer 41.

The second adhesive layer 41 can bond a portion of the fluffy carbon nanotubes 10 of the thermal conductive layer 12 adjacent to the second adhesive layer 41 together.

Figure 10:
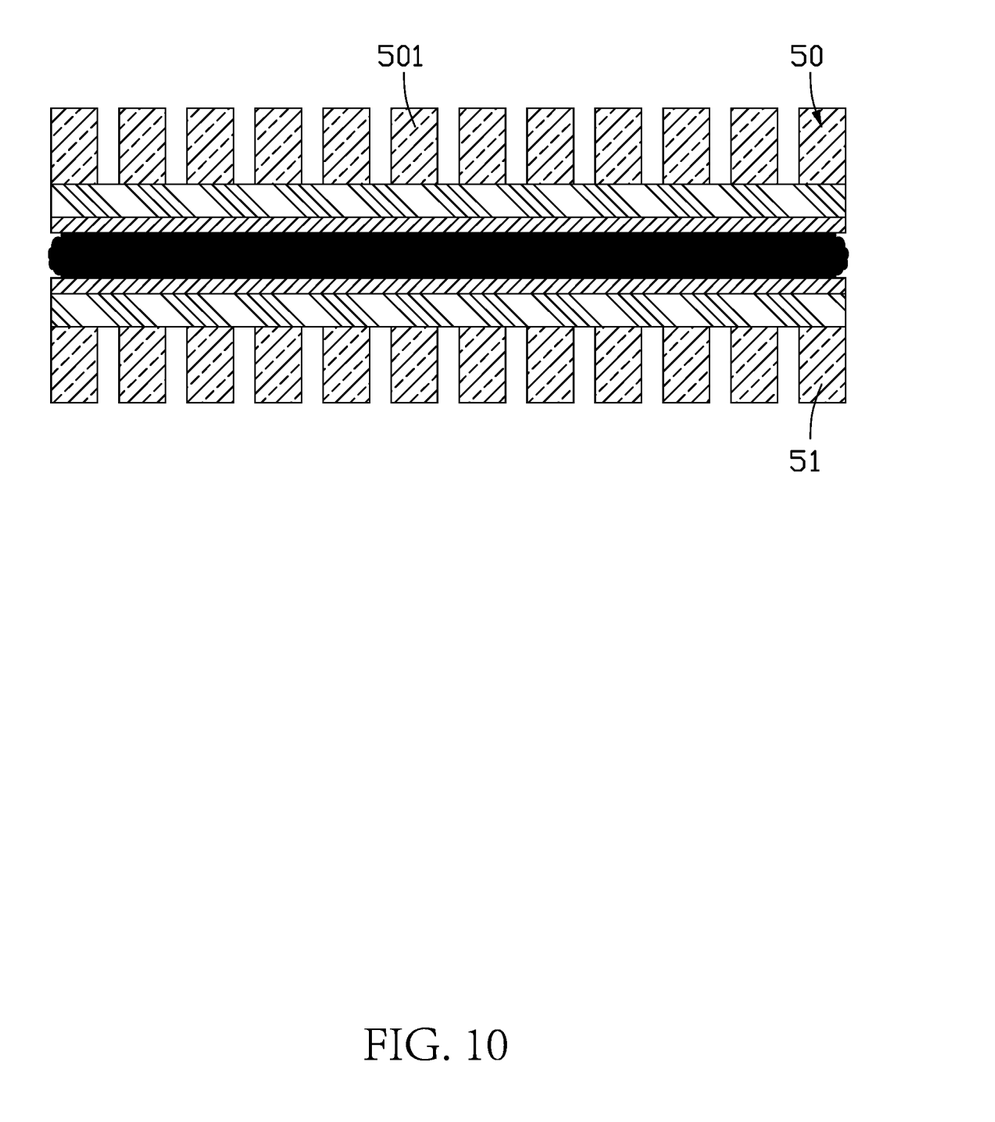
FIG. 10 is a diagrammatic view wherein a first copper foil layer and a second copper foil layer of FIG. 9 are etched to obtain a first circuit layer and a second circuit layer.

At block 10, referring to FIG. 10, the first copper foil layer 33 and the second copper foil layer 43 are respectively etched to obtain a first circuit layer 50 and a second circuit layer 51. The first circuit layer 50 includes at least two solder pads 501.

In some embodiments, the first circuit layer 50 and the second circuit layer 51 can be obtained by an exposure and development process. The exposure and development process includes steps of dry film pressing, exposing, developing, etching, and dry film removing.

Figure 11:
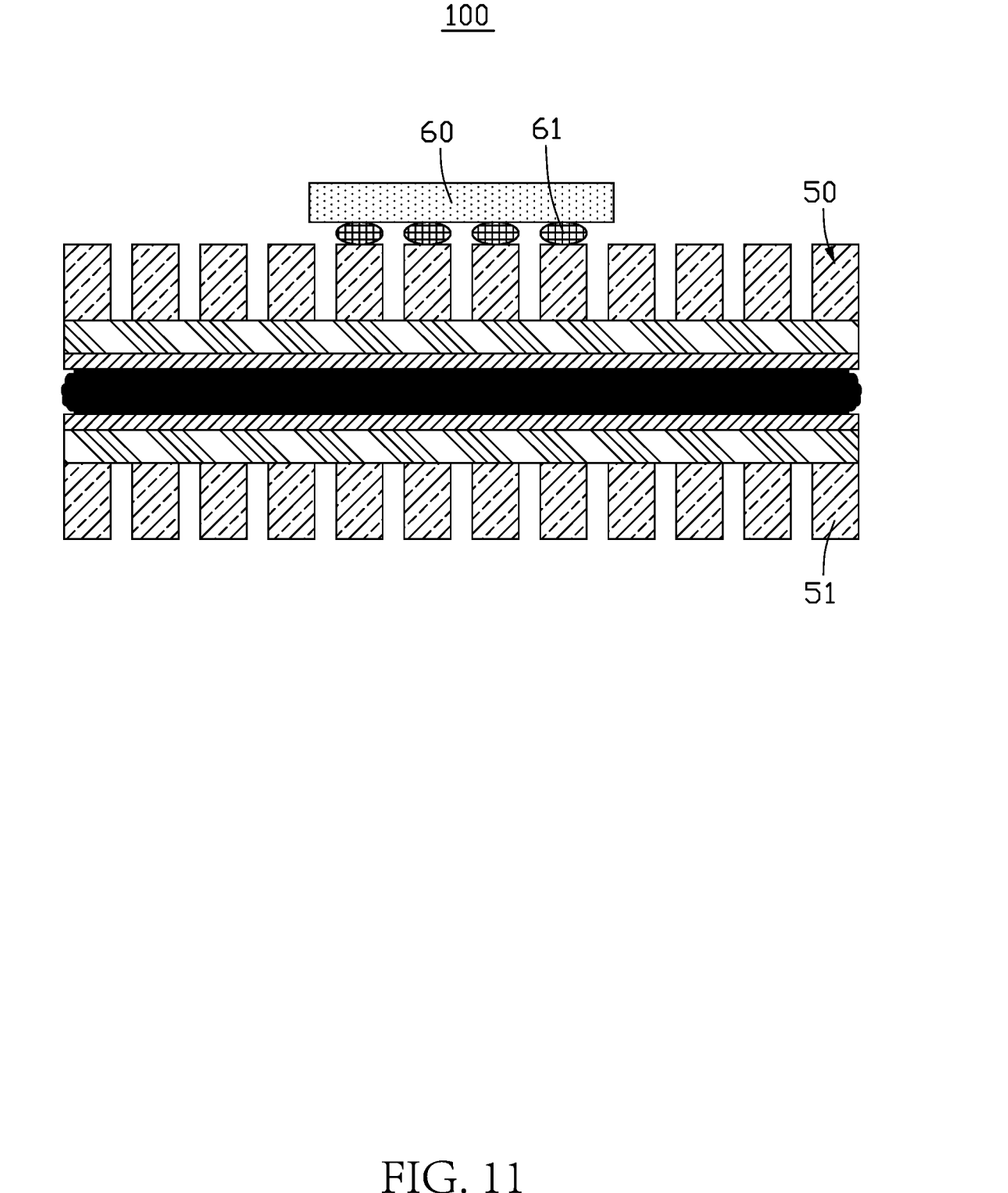
FIG. 11 is a diagrammatic view of a circuit board obtained by mounting an electronic component on the first circuit layer of FIG. 10.

At block 11, referring to FIG. 11, an electronic component 60 is mounted on the solder pads 501. Then, the circuit board 100 is obtained.

In some embodiments, the electronic component 60 can be mounted on each solder pad 501 through a solder ball 61.

Figure 12:
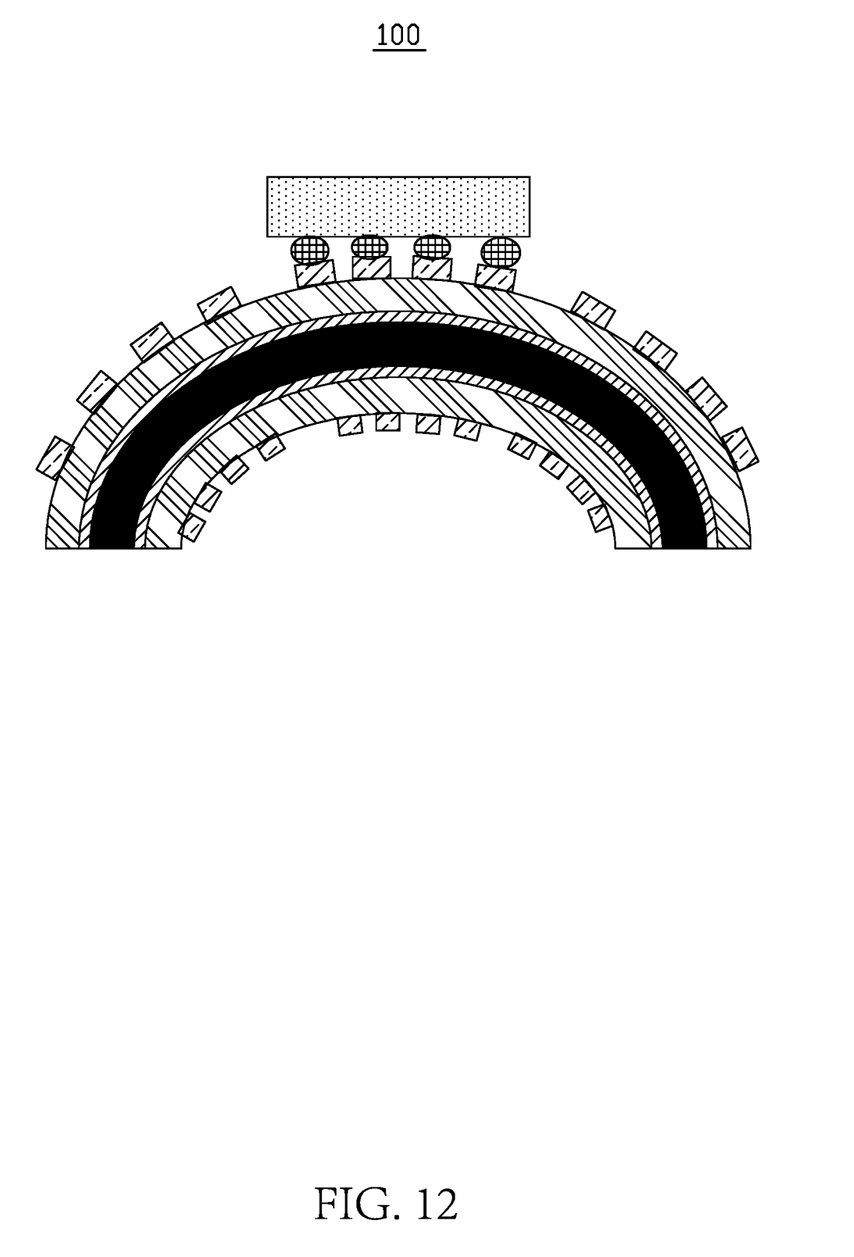
FIG. 12 is a diagrammatic view wherein the circuit board of FIG. 11 is bent.

At block 12, referring to FIG. 12, the circuit board 100 is bent to a desired shape, so that the circuit board 100 can be mounted on a curved surface. That is, the circuit board 100 is a flexible printed circuit board.

When in use, heat generated by the electronic component 60 can be successively conducted to the first dielectric layer 32 and the thermal conductive layer 12 via the solder pads 501, and the direction of the heat is along the thickness direction of the circuit board 100. The thermal conductive layer 12 includes the fluffy carbon nanotubes 10, which can function as a heat dissipation medium to dissipate the heat to the outside environment. Due to the grain orientation of the fluffy carbon nanotubes 10, the fluffy carbon nanotubes 10 can conduct heat evenly along two perpendicular directions in a plane of the thermal conductive layer 12, which facilitates rapidly and uniformly heat conduction to different positions of the thermal conductive layer 12 and then to the outside environment. Moreover, the material of the fluffy carbon nanotubes 10 is relatively soft, which is beneficial to improve the flexibility of the circuit board 100.

In addition, the fluffy carbon nanotubes 10 are laminated to form the thermal conductive layer 12. Since the material of the fluffy carbon nanotubes 10 is relatively soft, the fluffy carbon nanotubes 10 can extend along the surface of the first peelable film 20 or the second peelable film 21 during the pressing process, so that the fluffy carbon nanotubes 10 can evenly distribute in the thermal conductive layer 12. Compared with a manufacturing method of the thermal conductive layer 12, which attaches a catalyst to the peelable film, place the peelable film in a high-temperature reaction furnace, and introducing reactant gas into the furnace, the present disclosure can prepare the thermal conductive layer 12 simply through a pressing process, which may reduce cost and energy consumption.

Although the embodiments of the present disclosure have been shown and described, those having ordinary skill in the art can understand that changes may be made within the principles of the present disclosure, up to and including the full extent established by the broad general meaning of the terms used in the claims. It will, therefore, be appreciated that the embodiments described above may be modified within the scope of the claims.

What is claimed is:

1. A method for manufacturing a circuit board, comprising:
   stacking a first peelable film on a second peelable film, and disposing fluffy carbon nanotubes between the first peelable film and the second peelable film, thereby obtaining a carbon nanotube layer;
   pressing the first peelable film, the carbon nanotube layer, and the second peelable film to compact the fluffy carbon nanotubes, thereby obtaining a thermal conductive layer;
   removing the first peelable film, and disposing a first adhesive layer, a first dielectric layer, and a first circuit layer on a side of the thermal conductive layer away from the second peelable film;
   removing the second peelable film, and disposing a second adhesive layer, a second dielectric layer, and a second circuit layer on a side of the thermal conductive layer away from the first adhesive layer;
   mounting an electronic component on the first circuit layer, thereby obtaining the circuit board.

2. The method of claim 1, wherein disposing the first adhesive layer, the first dielectric layer, and the first circuit layer on the side of the thermal conductive layer away from the second peelable film further comprises:
   providing a first copper-cladding substrate, the first copper-cladding substrate comprising a first adhesive layer, a first dielectric layer, and a first copper foil layer stacked in that order;
   laminating the first copper-cladding substrate on the side of the thermal conductive layer away from the second peelable film, so that the thermal conductive layer is between the first adhesive layer and the second peelable film;
   pressing the first copper-cladding substrate, the thermal conductive layer, and the second peelable film;
   etching the first copper foil layer to obtain the first circuit layer.

3. The method of claim 2, wherein disposing the second adhesive layer, the second dielectric layer, and the second circuit layer on the side of the thermal conductive layer away from the first adhesive layer further comprises:
   providing a second copper-cladding substrate, the second copper-cladding substrate comprising a second adhesive layer, a second dielectric layer, and a second copper foil layer stacked in that order;
   removing the second peelable film, so that the thermal conductive layer is between the first adhesive layer and the second adhesive layer;
   pressing the second copper-cladding substrate, the thermal conductive layer, and the first copper-cladding substrate;
   etching the second copper foil layer to obtain the second circuit layer.

4. The method of claim 1, wherein diameters of the fluffy carbon nanotubes are approximately 70 mm.

5. The method of claim 1, wherein the first peelable film and the second peelable film respectively define a first alignment hole and a second alignment hole, after the first peelable film and the second peelable film are laminated, the first alignment hole is aligned with the second alignment hole; and
   wherein before pressing the first peelable film, the carbon nanotube layer, and the second peelable film, the method further comprises:
   inserting a positioning pillar through the first alignment hole, the heat conduction layer, and the second alignment hole.

6. The method of claim 1, wherein the first alignment hole passes through the first peelable film, and the second alignment hole passes through the second peelable film.

7. The method of claim 1, wherein the first circuit layer comprises at least two solder pads, and the electronic component is mounted on each of the solder pads by a solder ball.

8. The method of claim 1, wherein after mounting the electronic component, the method further comprises:
   bending the circuit board.

9. The method of claim 1, wherein each of the first peelable film and the second peelable film is made of a material selected from epoxy resin, polypropylene, BT resin, polyphenylene oxide, polyimide, polyethylene terephthalate, polyethylene naphthalate, and any combination thereof.

10. The method of claim 1, wherein each of the first dielectric layer and the second dielectric layer is made of a material selected from epoxy resin, polypropylene, BT resin, polyphenylene oxide, polyimide, polyethylene terephthalate, polyethylene naphthalate, and any combination thereof.

* * * * *